United States Patent [19]
Larimer

[11] Patent Number: 5,204,227
[45] Date of Patent: Apr. 20, 1993

[54] METHOD OF DEVELOPING PHOTOPOLYMERIZABLE PRINTING PLATES AND COMPOSITION THEREFOR

[75] Inventor: Victor L. Larimer, Middletown Township, Bucks County, Pa.

[73] Assignee: 3D Agency, Inc., Benton Harbor, Mich.

[21] Appl. No.: 664,055

[22] Filed: Mar. 1, 1991

Related U.S. Application Data

[63] Continuation-in-part of Ser. No. 521,897, May 10, 1990, abandoned.

[51] Int. Cl.⁵ .............................................. G03F 7/32
[52] U.S. Cl. .................................. 430/331; 430/306; 430/309; 430/325
[58] Field of Search ............... 430/331, 325, 329, 309, 430/306; 134/38, 42, 3; 252/DIG. 8, 162, 166, 171, 542

[56] References Cited

U.S. PATENT DOCUMENTS

| | | | |
|---|---|---|---|
| 3,607,271 | 9/1971 | Helden et al. | 430/302 |
| 3,701,657 | 10/1972 | Moore et al. | 430/331 |
| 4,267,260 | 5/1981 | Miura et al. | 430/302 |
| 4,511,488 | 4/1985 | Matta | 252/162 |
| 4,533,487 | 8/1985 | Jones | 252/DIG. 8 |
| 4,732,695 | 3/1988 | Francisco | 252/162 |
| 4,740,247 | 4/1988 | Hayes et al. | 134/42 |
| 4,806,452 | 2/1989 | Hoffmann et al. | 430/325 |
| 4,836,950 | 6/1989 | Madsen et al. | 252/542 |
| 4,847,182 | 7/1989 | Worns et al. | 430/325 |
| 4,906,303 | 3/1990 | Freij | 134/38 |
| 4,983,224 | 1/1991 | Mombrun et al. | 134/42 |
| 5,011,621 | 4/1991 | Sullivan | 252/162 |
| 5,015,410 | 5/1991 | Sullivan | 252/162 |
| 5,049,300 | 9/1991 | Fusiak et al. | 134/38 |

*Primary Examiner*—Marion E. McCamish
*Assistant Examiner*—Janis L. Dote
*Attorney, Agent, or Firm*—Flynn, Thiel, Boutell & Tanis

[57] ABSTRACT

A method and composition for developing a relief image formed by exposing a portion of a photopolymerizable layer to actinic radiation and removing the portion of the photopolymerizable layer not exposed to actinic radiation by washing the unexposed portion with a developer composition comprising a monoterpene, N-methylpyrrolidone and, optionally, an aromatic alcohol. A nonionic surfactant can also be included in the developer composition.

17 Claims, No Drawings

METHOD OF DEVELOPING PHOTOPOLYMERIZABLE PRINTING PLATES AND COMPOSITION THEREFOR

This application is a continuation-in-part of U.S. Ser. No. 07/521 897, filed May 10, 1990, now abandoned.

BACKGROUND OF THE INVENTION

The present invention relates to an improved method and composition for developing a relief image by imagewise exposing a photopolymerizable layer to actinic radiation and subsequently removing the uncured material of the photopolymerizable layer by use of a developer composition to produce the relief image.

In the following description and claims, the term "cured" and derivatives thereof shall be used to describe material obtained by either (1) the photopolymerization of monomeric or low molecular weight compounds, or (2) the crosslinking of photocrosslinkable polymers. The term "uncured" and derivatives thereof shall be used to describe material which has not undergone either photopolymerization or photocrosslinking.

The use of actinic radiation, such as ultraviolet light, to form a relief pattern or image by the imagewise curing of a photopolymerizable layer is well known in the art and is typically used in preparing flexographic printing plates and relief patterns on semiconductor layers. These relief images or patterns are formed by placing an image-bearing process transparency, for example, a line or half-tone negative, over the photopolymerizable layer. The negative is designed to transmit actinic radiation through certain portions of it and to absorb or reflect actinic radiation at other portions so that the photopolymerizable layer underneath the negative is cured imagewise according to the portion of the negative that transmits the radiation. A transparent protective film, called a slip film, usually a polyamide resin film, is commonly provided between the negative and the photopolymerizable layer in order to prevent the negative from damaging the photopolymerizable layer.

After the exposure to actinic radiation, the slip film must be removed from the photopolymerizable layer and the uncured material of the photopolymerizable layer must be removed in order to produce the desired relief image or pattern. Typically, a solvent or developer is used which will solvate the portion of the photopolymerizable layer that has not been cured by the actinic radiation, but will not substantially affect the portion of the photopolymerizable layer that has been cured by the actinic radiation. Typical developers used in such a process are chlorohydrocarbons, such as chloroform, trichloroethylene, tetrachloroethylene or 1,1,1-trichloroethane, either singly or in a mixture with a suitable lower alcohol, such as n-butanol; saturated cyclic or acyclic hydrocarbons, such as petroleum ether, hexane, heptane, octane, cyclohexane or methylcyclohexane; aromatic hydrocarbons, such as benzene, toluene or xylene; or lower aliphatic ketones, such as acetone, methylethyl ketone or methylisobutyl ketone.

In using the prior art developer compositions described above, it usually takes a disadvantageously long time to remove the portion of the photopolymerizable layer which has not been cured. Moreover, the cured relief patterns or images swell or distort during the washing or removal of the uncured portion of the photopolymerizable layer by the developer composition. Further, under microscopic inspection, the printing surface may exhibit a nonsmooth surface due to cracks, crevices, bumps and other surface irregularities and this may detrimentally affect the printing quality. Additionally, these prior developers are toxic and must be subjected to special handling procedures and some have low flash points which makes very hazardous the separation of them from the removed or washed-out, uncured, photopolymerizable material.

U.S. Pat. No. 4,806,452 discloses a developer composition which contains, as an essential component, at least one monoterpene and up to 40% by weight of an additional solvent.

Flexographic photopolymer printing plates can be made of a variety of different materials, including:

1. block copolymers of styrene and butadiene or styrene and isoprene (U.S. Pat. Nos. 4,323,636, 4,323,637, 4,423,135 and 4,369,246),
2. a mixture of nitrile rubber, an addition photopolymerizable tri- or tetra-unsaturated ester of acrylic or methacrylic acid and an addition polymerization initiator activated by actinic radiation (British Patent No. 1358062),
3. a mixture of a high molecular weight butadiene/acrylonitrile copolymer containing carboxyl groups, a low molecular weight butadiene polymer which may or may not contain carboxyl groups, an ethylenically unsaturated monomer and a free-radical generating system (U.S. Pat. No. 4 177 074), and
4. a mixture of a high molecular weight butadiene/acrylonitrile copolymer containing carboxyl groups, a high molecular weight butadiene/acrylonitrile copolymer which does not contain carboxyl groups, an ethylenically unsaturated monomer and a free radical generating system (U.S. Pat. No. 4,517,279). The developer compositions needed for development of these different types of plates vary depending on the specific composition of the plate employed. For example, a developer suitable for the development of Flex-Light type FL-SKOR and Flex-Light type FL-KOR photopolymer plates (registered trademarks of W. R. Grace & Co.) may not be effective in the development of Flex-Light type FL-1 and Flex-Light type FL-AL photopolymer plates (registered trademarks of W. R. Grace & Co.).

U.S. Pat. No. 4,847,182 discloses a developer composition comprising a terpene which can be blended with a nonsolvent, such as benzyl alcohol, which nonsolvent is effective to promote the spontaneous separation of uncured material from the developer solution after the plate has been developed. Emulsifiers, such as polyethylene glycol mono(nonylphenyl) ethers, can be incorporated in the developer composition so that the plate can be rinsed with water prior to oven drying.

It is an object of the present invention to provide a developer composition for use in the preparation of a relief image or pattern by photopolymerization in which the washout time and the drying time are substantially shorter in comparison with conventional processes, the photopolymerized relief images or patterns do not undergo significant permanent distortion or swelling during washout with the developer composition and the developer composition can be economically recovered from the uncured photopolymerizable material without special handling procedures and without significant risk of explosion.

It is a further object of the present invention to provide a developer composition which has a low toxicity and volatility, is biodegradable and can be used for developing relief images or patterns produced on a wide variety of types of photopolymer plates.

It is a still further object of the present invention to provide a developer composition which will dissolve the slip film during the development of the plate and thereby eliminate the step of removing the slip film from the photopolymer plate.

It is a still further object of the present invention to provide a developer composition which enables the developed photopolymer plate to be rinsed with plain water thereby eliminating the tackiness produced in the formed image or pattern by the conventional solvent rinses and allowing the easy disposal of waste rinse solution.

SUMMARY OF THE INVENTION

These and other objects of the present invention are accomplished by providing a process and a developer composition for producing a relief image or pattern on a photopolymerizable layer by removing the uncured portion of the photopolymerizable layer by washing it with a developer composition comprising a monoterpene and N-methylpyrrolidone. An aromatic alcohol may be employed in the developer composition when a slip film is present on the photopolymerizable layer and that slip film is not readily dissolved by N-methylpyrrolidone.

In a second aspect of the present invention, the developer composition is a mixture of a monoterpene, N-methylpyrrolidone, an aromatic alcohol and a nonionic surfactant. This latter composition is water-rinsable.

In a third aspect of the present invention, the developer composition is a mixture of a monoterpene, N-methylpyrrolidone, a nonionic surfactant, an organic solvent having an ether-ester functionality and, optionally, an aromatic alcohol. This developer composition is also water-rinsable.

DETAILED DESCRIPTION OF THE INVENTION

According to the first, preferred embodiment of the invention, the developer composition of the present invention comprises a mixture of a monoterpene, N-methylpyrrolidone and, optionally, an aromatic alcohol. As the monoterpene, p-methane, borneol, menthone, d- and l-limonene, $\alpha$-terpineol, $\alpha$-terpinene, $\gamma$-terpinene, terpinolene, $\alpha$-pinene, $\beta$-pinene, $\delta$-pinene, citronellol and mixtures of these monoterpenes can be used. d-Limonene is especially preferred as the monoterpene component. There can be used commercially available d-limonene obtained from orange peel and/or pine trees. d-Limonene is nontoxic. Reagent grade d-limonene has a boiling point of about 175° C. The high boiling temperature and vapor pressure of d-limonene enable it to be separated effectively and efficiently from the uncured photopolymerizable material that is dissolved in the developer composition during the washout step. The amount of the monoterpene component in the developer composition is from 10 to 60 wt. %, preferably from 35 to 50 wt. %, based on the total weight of the developer composition.

N-methylpyrrolidone is contained in the developer composition, according to the invention, and it is unexpectedly effective to increase the versatility of the developer composition so that a very wide variety of different types of photopolymer printing plates can be washed by the developer composition with good results and with improved plate quality. Particularly, the developer composition can be effectively used in the development of all commercially available flexographic photopolymer printing plates, including Flex-Light type FL-1 and Flex-Light type FL-AL acrylic ester photopolymer plates (registered trademarks of W. R. Grace & Co.) which have heretofore required the use of a developer containing a chlorinated hydrocarbon. The amount of N-methylpyrrolidone present in the invention composition is from 10 to 50 wt. %, preferably from 20 to 40 wt. %, based on the total weight of the developer composition. The amount of N-methylpyrrolidone in the developer composition is less than the amount of the monoterpene component. Preferably, the weight ratio of N-methylpyrrolidone/monoterpene is from about 0.95/1 to about 0.5/1, more preferably, from about 0.8/1 to about 0.6/1. N-methylpyrrolidone has a boiling point of about 202° C. so that it has a relatively high flash point and it can be easily separated from the uncured photopolymerizable material that is dissolved in the developer composition during the washout step.

The aromatic alcohol is contained in the developer composition of the present invention in applications where the slip film covering the photopolymerizable material is not readily dissolved during the development step by the N-methylpyrrolidone. Of the aromatic alcohols, benzyl alcohol has proved to be particularly effective for dissolving the slip film without any attendant negative effects on the photopolymerized relief pattern or image. The content of benzyl alcohol in the developer composition of the present invention is in the range of from 0 to 35 wt. %, such as, from 1 to 35 wt. %, preferably from about 10 to about 20 wt. %, based on the total weight of the developer composition. The amount of benzyl alcohol is less than the amount of N-methyl-pyrrolidone. Preferably, the weight ratio of N-methyl-pyrrolidone/benzyl alcohol is from 4/1 to about 1/1, more preferably about 2.5/1 to about 1.5/1. Benzyl alcohol has a boiling point of about 205° C. and it can be easily separated from the uncured photopolymerizable material that is dissolved in the developer composition during the washout step.

In the event that the photopolymerizable plate does not have a slip film or it is removed in a different way, then the benzyl alcohol can be omitted from the developer composition.

In a second, preferred embodiment of the present invention, the developer composition additionally comprises a nonionic surfactant. It has been found that the presence of a nonionic surfactant in the developer composition enables the developed photopolymer layer to be rinsed with water before the layer is dried. This reduces the permanent distortion or swelling of the developed relief image or pattern during drying. Additionally, the nonionic surfactant emulsifies the ingredients of the developer composition and the uncured material of the photopolymer plate and enables the waste aqueous rinse solution to be disposed of in a sewer or by another environmentally safe manner. The nonionic surfactant preferably used in the present invention is one or a mixture of nonylphenolpolyethylene glycol ethers in which from about 6.0 to 9.5 moles of ethylene oxide are condensed with one mole of nonylphenol. It is especially preferred that the nonionic surfactant composition is a blend of nonylphenolpolyethylene (9.5) glycol ether and nonylphenolpolyethylene (6.0) glycol ether in 2:1 weight ratio. Other effective nonionic surfactants are $C_9$ to $C_{15}$ primary alcohols that have been ethoxylated with from 5 to 10 moles of ethylene oxide to form nonionic detergents. Most effective of these alcohol ethoxylates are those having a hydrophile/lipophile balance (HLB) number between 7 and 14. These ethoxylated alcohols are preferred for use in areas with limited effluent sewage treatment facilities because they are more rapidly biodegraded.

The nonionic surfactant is contained in the developer composition of the present invention in an amount of from 5 to 12 wt. %, based on the total weight of the developer composition, preferably about 8 to 10 wt. %. Preferably, the amount of the nonionic surfacant is less than the amount of benzyl alcohol.

In the third, most preferred embodiment of the present invention, the developer composition additionally comprises an organic solvent having an ether-ester functionality. The presence of an organic solvent having an ether-ester functionality in the developer composition enables the terpene content to be reduced and improves the wash out and relief quality of the developed plates for improved print images. The reduction in the terpene content of the developer also reduces the odor problems associated with a terpene-containing developer and the attacks on the seals in the equipment used in developing the plates. The organic solvent having an ether-ester functionality is preferably ethyl-3-ethoxypropionate and is commercially available under the name of VCAR ®Ester EEP (registered trademark of Union Carbide Corp.). Other organic solvents having an ether-ester functionality such as 2-ethoxyethylacetate can also be used in the present invention.

The organic solvent having an ether-ester functionality is contained in the developer composition of the present invention in an amount of from 10 to 60 wt. %, based on the total weight of the developer composition. As with the second embodiment of the present invention, the presence of the aromatic alcohol is optional.

The presently most preferred, water-rinsable developer composition of the present invention consists of 20 wt. % of N-methylpyrrolidone, 46 wt. % of d-limonene, 0-6 wt. % of benzyl alcohol, 4 wt. % of nonylphenolpolyethylene (9.5) glycol ether, 4 wt. % of nonylphenolpolyethylene (6.0) glycol ether and 20-26 wt. % of ethyl-3-ethoxypropionate.

The developer composition of the present invention can be used to develop all presently known types of photopolymer plates, is nontoxic, eliminates the step of removing the slip film and can be more efficiently recovered because of the high temperature and vapor pressure of its components, including the monoterpene. These and other advantages of the present invention are shown in the following examples.

In the following examples, the equipment used to perform the exposure, washing and drying of the photopolymer plates was the Anderson & Vreeland Photopolymer System, commercially available from Anderson & Vreeland, Inc., Bryan, Ohio. The plate processing equipment was of two types, namely, 1. a 12 inch x 15 inch flat bed for receiving the photopolymer plate and in which a brush is disposed above the plate and is moved in an orbital pattern so that its bristles contact and remove uncured material from the plate, and
2. a 30 inch x 44 inch unit in which the photopolymer plate is mounted on an oscillatable drum and 4 rotary brushes are disposed in association with the drum so that their bristles contact and remove uncured material from the plate.

The exposure unit employed UV fluorescent-type lamps. When the plate was subjected to "back exposure", that is, uniform exposure on the back without a negative, the back side of the photopolymer was uniformly cured to a selected depth to form a so-called "floor" underneath the relief areas. When the plate was subjected to "face exposure", that is, imagewise exposure on the face, using a negative, latent relief image areas of a selected depth were formed in the face of the photopolymer layer. A W. R. Grace test negative was used as the negative for the tests. Development of the photopolymer plate with the solution removed the uncured photopolymer material whereby to form relief areas projecting from the floor. In those instances in which back exposure and face exposure were not conducted, the test measured the resistance to dissolving of the uncured photopolymer material in the developing solution.

Example 1

A developer solution was prepared by mixing 30 parts by weight of N-methylpyrrolidone, 50 parts by weight of d-limonene, 11 parts by weight of benzyl alcohol, 6 parts by weight of nonylphenolpolyethylene (9.5) glycol ether and 3 parts by weight of nonylphenolpolyethylene (6.0) glycol ether.

The solution was placed in the 12 inch x 15 inch, orbital brush, flat bed, plate processor. A photopolymer plate with a photopolymer layer having a thickness of 0.067 inch (KOR, available from W. R. Grace & Co.) was uniformly pre-exposed on the back (back exposure) for 20 seconds and then was exposed imagewise through a photographic negative placed on the protective layer (face exposure) for 5 minutes and 20 seconds. The plate was then washed with the above-described solution for 4¼ minutes in the plate processor. The plate was rinsed with plain tap water and then was dried at 150° F. for 1 hour. The depth of the floor (uniformly cured back of the plate) was 0.030 inches. The relief image was 0.037 inches deep. The sidewall structure of the relief image elements was good. Undermining of the sidewalls and rounding of the edges was not observed.

Additional commercially available photopolymer plates, which, however, were not back exposed or face exposed, were washed with the above-described developer solution in similar fashion. The following table lists the processing conditions and results. All the tests were conducted with the 12 inch x 15 inch flat bed washing unit.

TABLE I

| Plate Type | Photopolymer Layer Thickness (inches) | Back Exposure | Face Exposure | Washing Time (mins.) | Depth of Relief Areas (inches) |
|---|---|---|---|---|---|
| Grace FL-AL | 0.067 | None | None | 10 | 0.031 |
| Grace FL-AL | 0.067 | None | None | 12 | 0.035 |
| DuPont Cyrel LP | 0.067 | None | None | 5 | 0.040 |
| BASF | 0.067 | None | None | 4 | 0.046 |
| DuPont Cyrel LP | 0.067 | None | None | 10 | 0.045 |
| DuPont Cyrel LP | 0.067 | None | None | 4 | 0.042 |
| Grace FL-1 | 0.090 | None | None | 15 | 0.046 |

Example 2

A developer solution was prepared by mixing 32 parts by weight of N-methylpyrrolidone, 37 parts of d-limonene, 22 parts of benzyl alcohol and 9 parts of nonylphenolpolyethylene (9.5) glycol ether.

The solution was added to the 30 inch x 44 inch washing unit described above. Various photopolymer plates were exposed and then developed with the developing solution. The following table lists the processing conditions and results.

TABLE II

| Plate Type | Photopolymer Layer Thickness (inches) | Back Exposure | Face Exposure | Washing Time (mins.) | Depth of Relief Areas (inches) |
|---|---|---|---|---|---|
| Grace KOR | 0.067 | 10 secs. | 5 mins. | 6 | 0.030 |
| Grace KOR | 0.250 | 5 mins. | 10 mins. | 5 | 0.035 |
| Grace KOR | 0.250 | 5 mins. | 10 mins. | 10 | 0.070 |
| Grace KOR | 0.250 | 5 mins. | 10 mins. | 15 | 0.107 |
| Grace KOR | 0.250 | 5 mins. | 10 mins. | 20 | 0.135 |
| Grace KOR | 0.250 | None | None | 20 | 0.150 |
| DuPont Cyrel LP | 0.250 | 2 mins. | 10 mins. | 6 | 0.040 |
| Grace FL-1 | 0.090 | 1½ mins. | 8 mins. | 12 | 0.030 |

Example 3

A developer solution was prepared by mixing 46 parts by weight of d-limonene, 20 parts of N-methylpyrrolidone, 4 parts of nonylphenolpolyethylene (9.5) glycol ether, 4 parts of nonylphenolpolyethylene (6.0) glycol ether and 26 parts of ethyl-3-ethoxypropionate.

The solution was placed in the 12 inch x 15 inch, orbital brush, flat bed, plate processor. Various photopolymer plates were exposed and then developed with the developing solution. The following table lists the processing conditions and results.

TABLE III

| Plate Type | Photopolymer Layer Thickness (inches) | Back Exposure | Face Exposure | Washing Time (mins.) | Depth of Relief Areas (inches) |
|---|---|---|---|---|---|
| Grace KOR | 0.067 | 20 secs. | 5 mins. | 4 | 0.037 |
| Grace FL-AL | 0.090 | 1 min. | 8 mins. | 10 | 0.050 |
| Grace FL-AL | 0.067 | 1 min. | 8 mins. | 10 | 0.038 |
| Grace FL-1 | 0.090 | 1 min. | 8 mins. | 10 | 0.050 |
| Grace KOR | 0.067 | 20 secs. | 5 mins. | 4 | 0.040 |

The components of the developer composed can be easily separated from the uncured photopolymer contained therein, for example, by steam distillation, atmospheric distillation or vacuum distillation.

It would be obvious to those skilled in the art that many modifications may be made within the scope of the present invention without departing from the spirit thereof, and the invention includes all such modifications.

The embodiments of the invention in which an exclusive property or privilege is claimed are defined as follows:

1. A devloper composition consisting essentially of from 10 to 60 wt. % of a monoterpene, from 10 to 50 wt. % of N-methylpyrrolidone, from 1 to 35 wt. % of an aromatic alcohol and from 5 to 12 wt. % of a nonionic surfactant, said wt. % being based on the total weight of the developer composition and the weight ratio of N-methylpyrrolidone/aromatic alcohol being from about 4:1 to about 1:1.

2. The developer composition of claim 1, wherein said monoterpene is d-limonene.

3. The developer composition of claim 2, wherein said d-limonene is obtained from orange peel.

4. The developer composition of claim 2, wherein said d-limonene is obtained from orange peel and pine trees.

5. The developer composition according to claim 2, containing from 35 to 50 wt. % of d-limonene and from 10 to 50 wt. % N-methylpyrrolidone.

6. The developer composition of claim 2, consisting essentially of from 35 to 50 wt. % of d-limonene, from 20 to 40 wt. % of N-methylpyrrolidone, from 10 to 20 wt. % of benzyl alcohol and from 5 to 12 wt. % of nonionic surfactant.

7. The developer composition of claim 6, wherein said nonionic surfactant is nonylphenolpolyethylene (9.5) glycol ether.

8. The developer composition of claim 6, wherein said nonionic surfactant is nonylphenolpolyethylene (6.0) glycol ether.

9. The developer composition of claim 6, wherein said nonionic surfactant is a blend of nonylphenolpolyethylene (9.5) glycol ether and nonylphenolpolyethylene (6.0) glycol ether in a 2:1 weight ratio.

10. The developer composition of claim 6, wherein said nonionic surfactant is selected from the group consisting of ethoxylates of primary alcohol having from 9 to 15 carbon atoms ethoxylated with 5 to 10 moles of ethylene oxide, and mixtures thereof.

11. The developer composition of claim 10, wherein said primary alcohol ethoxylates have a hydrophilic/lipophilic balance number between 7 and 14.

12. The developer composition of claim 1, wherein said aromatic alcohol is benzyl alcohol and the amount of benzyl alcohol is from 10 to 20 wt. %.

13. The developer composition of claim 1, consisting essentially of 20–40 wt. % of N-methylpyrrolidone, 35–50 wt. % of d-limonene, 10–20 wt. % of benzyl alcohol and 8–10 wt. % of the nonionic surfactant.

14. The developer composition of claim 13, wherein said nonionic surfactant is a blend of nonylphenolpolyethylene (9.5) glycol ether and nonylphenolpolyethylene (6.0) glycol ether in a 2:1 weight ratio.

15. The developer composition consisting essentially of from 10 to 60 wt. % of a monoterpene, from 10 to 50 wt. % of N-methylpyrrolidone, from 5 to 12 wt. % of a nonionic surfactant, from 10 to 60 wt. % of an organic solvent having an ether-ester functionality and from 0 to 35 wt. % of an aromatic alcohol, said wt. % being based on the total weight of the developer composition and, when the aromatic alcohol is present, the weight ratio of N-methylpyrrolidone/aromatic alcohol being from about 4:1 to about 1:1.

16. The developer composition of claim 15, wherein said aromatic alcohol is benzyl alcohol.

17. The developer composition of claim 15, consisting essentially of 20 wt. % of N-methylpyrrolidone, 46 wt. % of d-limonene, 0–6 wt. % of benzyl alcohol, 4 wt. % of nonylphenolpolyethylene (9.5) glycol ether, 4 wt. % of nonylphenolpolyethylene (6.0) glycol ether and 20–26 wt. % of ethyl-3-ethoxypropionate.

* * * * *